(12) United States Patent
Lee et al.

(10) Patent No.: US 10,950,669 B2
(45) Date of Patent: Mar. 16, 2021

(54) DISPLAY DEVICE

(71) Applicant: Samsung Display Co., Ltd., Yongin-si (KR)

(72) Inventors: Sang Wook Lee, Yongin-si (KR); Chang Ok Kim, Hwaseong-si (KR); Heon Sik Ha, Osan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 15 days.

(21) Appl. No.: 16/161,070

(22) Filed: Oct. 16, 2018

(65) Prior Publication Data
US 2019/0115395 A1 Apr. 18, 2019

(30) Foreign Application Priority Data
Oct. 18, 2017 (KR) .................. 10-2017-0135321

(51) Int. Cl.
*H01L 27/32* (2006.01)
*G06F 3/041* (2006.01)
(Continued)

(52) U.S. Cl.
CPC .......... *H01L 27/323* (2013.01); *G06F 3/0346* (2013.01); *G06F 3/0412* (2013.01); *G06F 3/0443* (2019.05); *G06F 3/0446* (2019.05); *G06F 3/0445* (2019.05); *G06F 2203/04102* (2013.01); *H01L 27/3211* (2013.01); *H01L 27/3244* (2013.01); *H01L 51/5256* (2013.01); *H01L 51/5275* (2013.01); *H01L 2251/5338* (2013.01); *H01L 2251/558* (2013.01)

(58) Field of Classification Search
CPC .............. H01L 27/323; H01L 51/5256; H01L 51/5275; H01L 2251/558; G06F 3/0412; G06F 3/044; G06F 2203/04102
See application file for complete search history.

(56) References Cited

U.S. PATENT DOCUMENTS

| 7,875,895 B2 | 1/2011 | Kwack et al. | |
| 2004/0004434 A1* | 1/2004 | Nishi | H01L 27/322 |
| | | | 313/506 |

(Continued)

FOREIGN PATENT DOCUMENTS

| KR | 10-0873082 | 12/2008 |
| KR | 10-2016-0065553 | 6/2016 |

(Continued)

*Primary Examiner* — Shaheda A Abdin
(74) *Attorney, Agent, or Firm* — H.C. Park & Associates, PLC

(57) ABSTRACT

A display device includes a light-emitting element, a thin film encapsulation layer disposed on the light-emitting element, a protection layer disposed on the thin film encapsulation layer, a first sensing electrode disposed on the protection layer, an insulating layer disposed on the first sensing electrode, and a second sensing electrode disposed on the insulating layer, in which at least one of the thin film encapsulation layer and the insulating layer has a multi-layer structure including first and second alternating layers forming at least three layers, and the first layer includes a first material having a first refractive index and the second layer includes a second material having a second refractive index different from the first refractive index.

18 Claims, 14 Drawing Sheets

(51) Int. Cl.
  *G06F 3/0346*  (2013.01)
  *G06F 3/044*  (2006.01)
  *H01L 51/52*  (2006.01)

(56) References Cited

U.S. PATENT DOCUMENTS

| | | | |
|---|---|---|---|
| 2012/0287605 A1* | 11/2012 | Chen | G02B 5/223 |
| | | | 362/97.1 |
| 2016/0155975 A1 | 6/2016 | Jin et al. | |
| 2016/0162060 A1* | 6/2016 | Hong | G06F 3/044 |
| | | | 428/201 |
| 2016/0299611 A1 | 10/2016 | Park | |
| 2016/0320885 A1* | 11/2016 | Kim | G06F 3/0412 |
| 2017/0060313 A1* | 3/2017 | Kim | G06F 3/044 |
| 2017/0373270 A1 | 12/2017 | Kim et al. | |

FOREIGN PATENT DOCUMENTS

| | | |
|---|---|---|
| KR | 10-2016-0121659 | 10/2016 |
| KR | 10-2017-0079506 | 7/2017 |

\* cited by examiner

DISPLAY DEVICE

CROSS REFERENCE TO RELATED APPLICATION

This application claims priority from and the benefit of Korean Patent Application No. 10-2017-0135321 filed on Oct. 18, 2017, which is hereby incorporated by reference for all purposes as if fully set forth herein.

BACKGROUND

Field

Exemplary embodiments of the invention relate generally to a display device, and more specifically, to a display device including a touch sensor.

Discussion of the Background

A display device may include a touch sensor as an input device, which allows a user to input information by contacting a screen of the display device using a finger, a pen, etc. A touch sensor may sense a user input according to various sensing types known in the art. For example, a capacitive type may sense a touch by detecting a variation in capacitance formed between two electrodes spaced apart from each other.

In general, manufacturing a flexible display device requires forming a thin display device, and thus, a touch sensor may be integrated into the display device. An on-cell type touch sensor is a type of a touch sensor that does not include its own substrate. Accordingly, a sensing electrode of the on-cell type touch sensor may be directly formed on any component or layer of the display device.

Transmittance of ambient light through a display device can cause undesired variations in colors in the display panel and/or damage to the light emitting elements contained therein.

The above information disclosed in this Background section is only for understanding of the background of the inventive concepts, and, therefore, it may contain information that does not constitute prior art.

SUMMARY

Applicant discovered that increasing the light transmittance through a thin film encapsulation layer on which a touch sensor is formed can decrease undesirable variation in color across a display panel, but also may cause damage to the sensitive light emitting elements therein.

Devices constructed according to exemplary embodiments of the invention are capable of reducing changes in the colors of a display panel by increasing transmittance of light through a thin film encapsulation layer while avoiding both damage to the light emitting elements caused by increased light transmittance, and an increase in thickness that would hinder flexibility of the display panel.

Additional features of the inventive concepts will be set forth in the description which follows, and in part will be apparent from the description, or may be learned by practice of the inventive concepts.

According to an exemplary embodiment, a display device includes a light-emitting element, a thin film encapsulation layer disposed on the light-emitting element, a protection layer disposed on the thin film encapsulation layer, a first sensing electrode disposed on the protection layer, an insulating layer disposed on the first sensing electrode, and a second sensing electrode disposed on the insulating layer, in which at least one of the thin film encapsulation layer and the insulating layer has a multi-layer structure including first and second alternating layers forming at least three layers, and the first layer includes a first material having a first refractive index and the second layer includes a second material having a second refractive index different from the first refractive index.

The difference between the refractive indices of the first material and the second material may be at least about 0.3.

The first refractive index may be in a range of about 1.8 to about 2.5.

The first layer may have a thickness in a range of about 400 angstroms to about 600 angstroms.

The second refractive index may be in a range of about 1.4 to about 1.5.

The second layer may have a thickness in a range of about 600 angstroms to about 800 angstroms.

The first material may include comprises at least one of $SiN_x$, $Al2O3$, and $TiO_x$, and the second material may include at least one of $SiO_x$, SiOC, and SiC.

The protection layer may include the multi-layered structure forming at least five layers of material having alternating refractive indices, and transmittance of light having a wavelength of about 380 nm to about 410 nm through the display device may be less than about 0.8.

The insulating layer may include the multi-layered structure forming at least five layers of material having alternating refractive indices, and transmittance of light having a wavelength of about 380 nm to about 410 nm through the display device may be less than about 0.8.

The display device may further include a first auxiliary electrode disposed on the insulating layer, in which the insulating layer may include a first opening overlapping the first sensing electrode, and the first auxiliary electrode may connect adjacent first sensing electrodes to each other through the first opening.

The display device may further include a second auxiliary electrode disposed on the same layer as the first sensing electrode, in which the insulating layer may have a second opening overlapping the second sensing electrode, and the second auxiliary electrode may connect adjacent second sensing electrodes to each other through the second opening.

The thin film encapsulation layer may include the multi-layered structure, and a difference of refractive indices between the first and second layers may be at least about 0.3.

The display device may further include a capping layer disposed on the second sensing electrode, in which wherein the capping layer may include comprise the multi-layered structure, and a difference of refractive indices between the first and second layers may be at least about 0.3.

According to another exemplary embodiment a display device includes a light-emitting element, a thin film encapsulation layer disposed on the light-emitting element, a first sensing electrode disposed on the thin film encapsulation layer, an insulating layer disposed on the first sensing electrode, and a second sensing electrode disposed on the insulating layer, in which the insulating layer includes a first layer and a second layer alternately stacked upon each other to form at least three layers, and the first layer includes a first material having a first refractive index and the second layer includes a second material having a second refractive index different from the first refractive index.

The difference of refractive indices between the first material and the second material may be at least about 0.3.

The first refractive index may be in a range of about 1.8 to about 2.5, and the thickness of the first layer may be in a range of about 400 angstroms to about 600 angstroms.

the second refractive index is in a range of about 1.4 to about 1.5; and

The thickness of the second layer may be in a range of about 600 angstroms to about 800 angstroms.

According to yet another exemplary embodiment, a flexible display device includes a light-emitting element, an encapsulation layer disposed on the light-emitting element, touch sensing electrodes disposed on the thin film encapsulation layer, an insulating layer disposed between the touch sensing electrodes, in which the encapsulation layer has substantially the same transmittance before and after being exposed to ultraviolet (UV) light, and the insulating layer reflects substantially all UV light incident thereto.

At least one of the insulating layer and the encapsulation layer may include a multi-layered structure forming at least three layers of material having alternating refractive indices.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
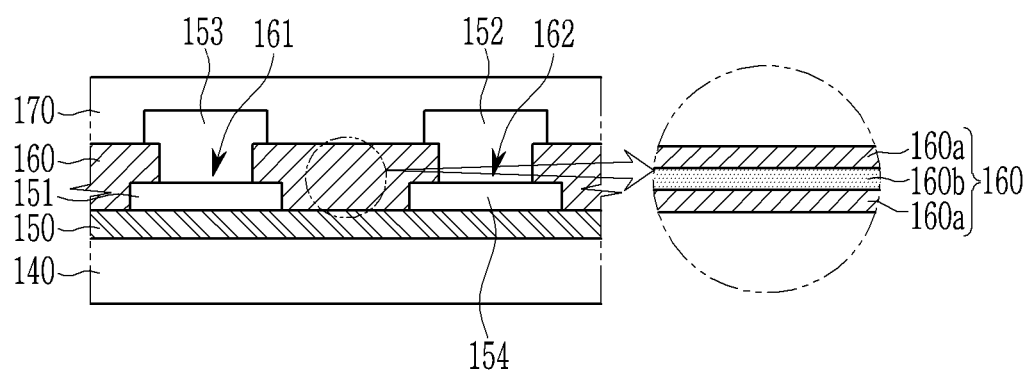
FIG. 1 is a cross-sectional view schematically showing an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a cross-sectional view schematically showing an exemplary embodiment of a display device constructed according to the principles of the invention.

Referring to FIG. 1, the display device according to an exemplary embodiment of the present invention includes a thin film encapsulation layer 140, a protection layer 150 positioned on the thin film encapsulation layer 140, a first sensing electrode 151 and a second auxiliary electrode 154 positioned on the protection layer 150, an electrode insulating layer 160 disposed on the first sensing electrode 151 and the second auxiliary electrode 154, a first auxiliary electrode 153 and a second sensing electrode 152 disposed on the electrode insulating layer 160, and a capping layer 170 disposed on the first auxiliary electrode 153 and the second sensing electrode 152.

The electrode insulating layer 160 according to the illustrated exemplary embodiment may include a first layer 160a and a second layer 160b. The first layer 160a may include a first material having a first refractive index, and the second layer 160b may include a second material having a second refractive index less than the first refractive index. The electrode insulating layer 160 may have a multilayer structure, in which the first and second layers 160a and 160b are alternately laminated to each other to form at least three layers.

The electrode insulating layer 160 includes a first opening 161 and a second opening 162. The first auxiliary electrode 153 is connected to the first sensing electrode 151 through the first opening 161, and the second sensing electrode 152 is connected to the second auxiliary electrode 154 through the second opening 162. The first auxiliary electrode 153 may connect first sensing electrodes 151 adjacent to each other, and the second auxiliary electrode 154 may connect second sensing electrodes 152 adjacent to each other.

FIG. 1 shows that the first sensing electrode 151 and the second sensing electrode 152 are disposed on different layers from each other, however the inventive concepts are not limited thereto. For example, the first sensing electrode 151 and the second sensing electrode 152 may be disposed on the same layer as each other. Also, the electrode insulating layer 160 may not have an opening or include only one opening. When the electrode insulating layer 160 does not have the opening, the first auxiliary electrode 153 and the second auxiliary electrode 154 may be omitted, which will be described in more detail below.

Figure 2:
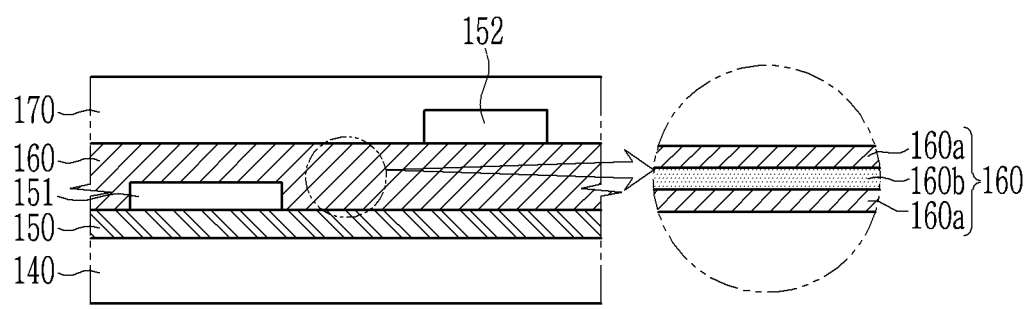
FIG. 2 is a cross-sectional view schematically showing a display device according to another exemplary embodiment of the invention.

FIG. 2 is a cross-sectional view schematically showing a display device according to another exemplary embodiment of the invention. Referring to FIG. 2, the first sensing electrode 151 and the second sensing electrode 152 are insulated via the electrode insulating layer 160.

Hereinafter, a display device according to exemplary embodiments will be described as having the structure of FIG. 1, however, the inventive concepts are not limited thereto. For example, a display device may have a structure including a protection layer 150 disposed between the thin film encapsulation layer 140 and the first sensing electrode 151 (see FIG. 2), or the electrode insulating layer 160 may be disposed on the first sensing electrode 151.

A light-emitting element is disposed under the thin film encapsulation layer 140. In the display device constructed according to the principles of the invention, the touch sensor including the first sensing electrode 151 and the second sensing electrode 152 may be disposed on the thin film encapsulation layer 140 of the display panel including the light-emitting element. That is, a separate substrate for the touch sensor may be omitted. As such, since the touch sensor is disposed on the thin film encapsulation layer 140, the thickness of the entire display device may be reduced. In this manner, as the touch sensor is disposed on the thin film encapsulation layer 140, which is then built into a display panel, a separate adhesion process of the touch sensor may not be necessary. Also, since a separate substrate for the touch sensor is generally rigid, a display device constructed according to the principles of the invention which omits a separate substrate for the touch sensor, enhances flexibility so the display may be advantageously formed as a flexible display device.

Referring to FIG. 1, the electrode insulating layer 160 according to the illustrated exemplary embodiment includes the first layer 160*a* and the second layer 160*b*. The first layer 160*a* includes the first material having the first refractive index, and the second layer 160*b* includes the second material having the second refractive index less than the first refractive index. The electrode insulating layer 160 may have a multilayer structure of at least three layers of first and second layers 160*a* and 160*b*, which are alternately laminated with each other.

A difference of refractive indices between the first material and the second material may be at least about 0.3. For example, the refractive index of the first material may be in a range of about 1.8 to about 2.5. In this case, the thickness of the first layer 160*a* including the first material may be in a range of about 400 angstroms to about 600 angstroms.

Also, the refractive index of the second material may be in a range of about 1.4 to about 1.5. In this case, the thickness of the second layer 160*b* including the second material may be in a range of about 600 angstroms to about 800 angstroms.

In this manner, the electrode insulating layer 160 including the alternately laminated (or stacked in some other manner) first and second layers 160*a* and 160*b* may cause substantially total reflection in a boundary surface of different refractive indices, thereby blocking light of a specific wavelength. Particularly, light having a wavelength in a range of about 380 nm to about 410 nm may be blocked from being incident inside the display panel.

As described above, the touch sensor is disposed on the thin film encapsulation layer 140. The thin film encapsulation layer 140 may include an organic layer and an inorganic layer alternately laminated upon each other, which may prevent moisture and oxygen from penetrating to the light-emitting element. In this case, when the display device is exposed to sunlight, a color change may occur in the thin film encapsulation layer 140 due to light having the wavelength of 380 nm to 410 nm in an ultraviolet (UV) region of the sunlight.

Figure 3:
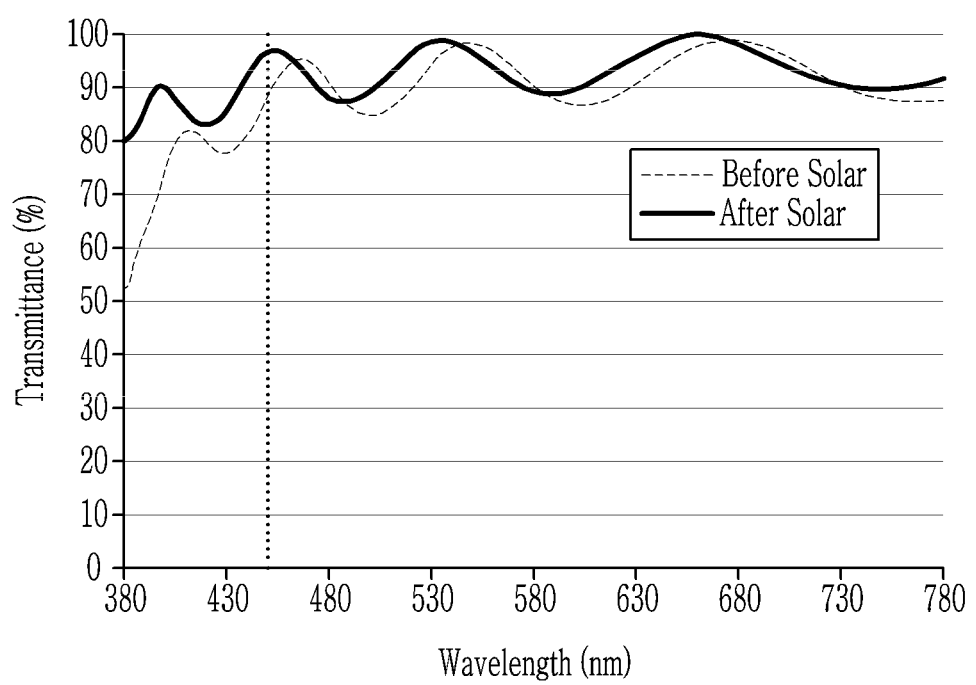
FIG. 3 is a graph showing transmittance of a thin film encapsulation layer before and after sunlight exposure according to a comparative example.
Figure 4:
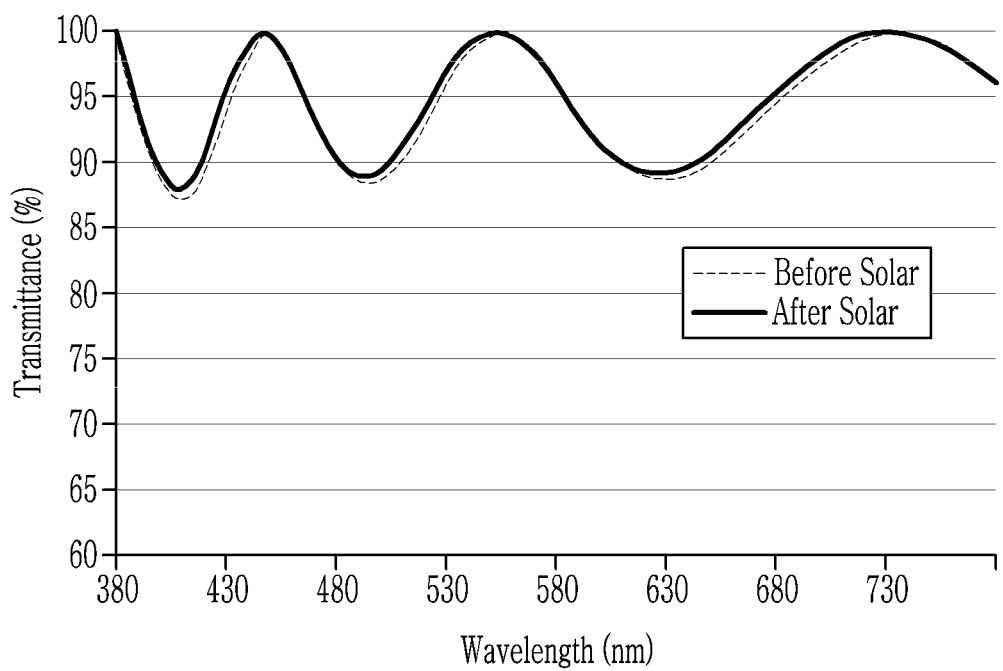
FIG. 4 is a graph showing transmittance of a thin film encapsulation layer before and after sunlight exposure according to another comparative example.

FIG. 3 is a graph showing transmittance of a thin film encapsulation layer before and after sunlight exposure according to a comparative example. FIG. 4 is a graph showing transmittance of a thin film encapsulation layer before and after sunlight exposure according to another comparative example. Referring to FIG. 3, in the wavelength region less than 430 nm, the difference of the transmittance is noticeable between before and after the thin film encapsulation layer 140 is exposed to sunlight. When the thin film encapsulation layer 140 is exposed to sunlight, the thin film encapsulation layer 140 may have different transmittance, which may cause the color of light emitted from the light-emitting element to be recognized differently by the human eye, thereby deteriorating the display quality.

Accordingly, the change of transmittance in the thin film encapsulation layer 140 should be minimized for the wavelength of 380 nm to 410 nm. For example, the transmittance of the thin film encapsulation layer 140 may be improved by selecting a material forming the thin film encapsulation layer 140 that has greater light transmittance characteristics as shown in FIG. 4. More particularly, when the transmittance of the thin film encapsulation layer 140 is improved due to the material included therein, the change of transmittance in the thin film encapsulation layer 140 in the wavelength of 380 nm to 410 nm is not observed between before and after its exposure to sunlight, and thus, and the display quality may be maintained. In this case, however, since the transmittance of light having the wavelength range of 380 nm to 410 nm is high, which is in the UV region of the sunlight, the light-emitting element of the display device may be exposed to light in the UV region to a greater extent, which may cause damage to the emission layer of the light-emitting element. Thus, preventing the color change in the thin film encapsulation layer 140 by increasing the light transmittance is inversely proportional to protecting the emission layer of the light-emitting element from UV radiation.

Accordingly, in a display device constructed according to the principles of the invention, the electrode insulating layer 160 includes the first layer 160*a* formed of the first material having the first refractive index, and the second layer 160*b* formed of the second material having the second refractive index less than the first refractive index, which are alternately stacked to form at least three layers.

When the first and second layers 160*a* and 160*b* having different refractive indices are alternately stacked in this manner, substantially total reflection may occur in the boundary surfaces between layers of different refractive indices. In order to cause substantially total reflection, the product of the refractive index 'n' and the thickness 'd' should be equal to ¼ of the wavelength of incident light or a multiple thereof.

As such, the thickness of the first layer 160*a* may be in a range of about 400 angstroms to about 600 angstroms. In this case, the refractive index of the first layer 160*a* may be about 1.8 to about 2.5. Likewise, the thickness of the second layer 160*b* may be in a range of about 600 angstroms to about 800 angstroms. In this case, the refractive index of the second layer 160*b* may be in a range of about 1.4 to about 1.5.

The first material of the first layer 160*a* may include at least one of $SiN_x$, $Al_2O_3$, and $TiO_x$. Also, the second material of the second layer 160*b* may include at least one of $SiO_x$, SiOC, and SiC. Here, x may be 1 to 4. However, the inventive concepts are not limited thereto, and the first material and the second material may include other materials.

In the exemplary embodiments, the number of laminated layers in the electrode insulating layer 160 including the first material and the second material may be at least three or more. When the number of laminated layers increases, the transmittance of light having the wavelength of about 380 nm to about 410 nm may further be decreased, which will be described in more detail below.

Figure 5:
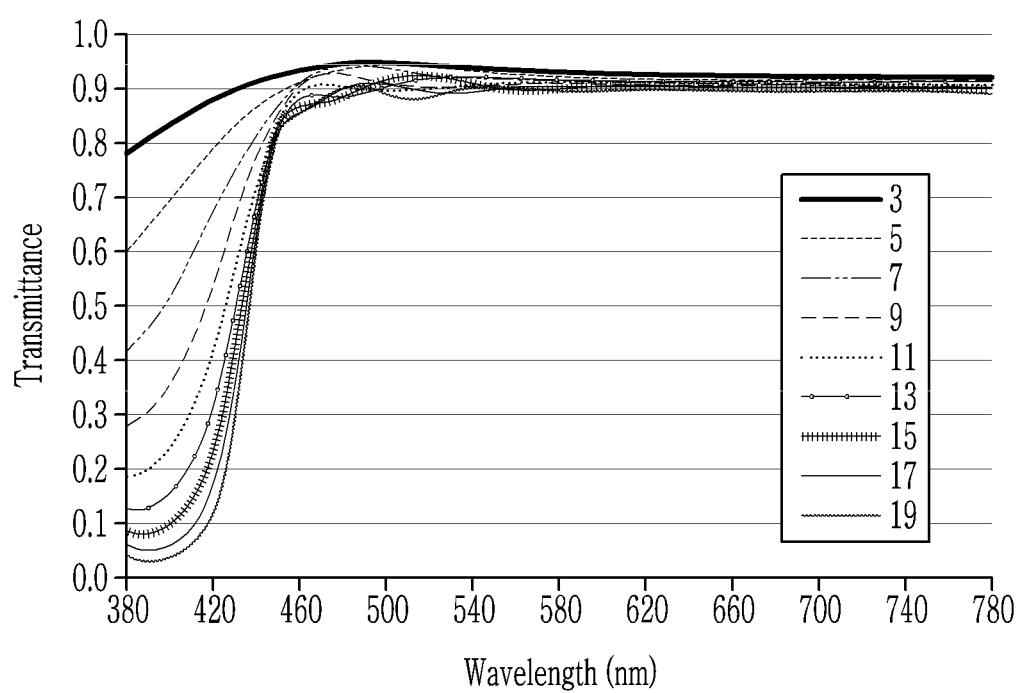
FIG. 5 is a graph showing transmittance before and after sunlight exposure according to the principles of the invention in which the number of laminated layers of a thin film encapsulation layer is varied.

FIG. 5 is a graph showing transmittance according to a number of laminated layers. In FIG. 5, the transmittance of the electrode insulating layers 160 including 3, 5, 7, 9, 11, 13, 15, 17, and 19 laminated layers respectively were measured. As can be seen in FIG. 5, the transmittance of light having a wavelength of about 380 nm to about 410 nm decreases as the number of laminated layers increases.

As described above, the electrode insulating layer 160 according to exemplary embodiments includes at least three stacked layers, but when the electrode insulating layer 160 includes 5 layers or more of the laminated layers, transmittance may be less than 0.8 for light having a wavelength of about 380 nm to about 410 nm. However, it should be noted that the increased number of laminated layers in the electrode insulating layer 160 may also increase the overall thickness of the display device, and accordingly, an appropriate range should be selected, especially if flexibility is a concern.

As described above, the display device constructed according to the principles of the invention includes the touch sensor having the first sensing electrode 151 and the second sensing electrode 152 disposed on the thin film encapsulation layer 140, and the electrode insulating layer 160 disposed between the first sensing electrode 151 and the second sensing electrode 152. The electrode insulating layer 160 includes the first material having the first refractive index and the second material having the second refractive index alternately laminated to each other to form at least three layers. In this case, when the difference of the first refractive index and the second refractive index is about 0.3 or more, light having a wavelength of about 380 nm to about 410 nm is blocked by the alternately laminated high refractive index layer and low refractive index layer. Accordingly, color change in the thin film encapsulation layer 140 may be reduced or prevented, and the damage to the light-emitting element caused by being exposed to UV light may be reduced or prevented.

FIG. 5 is a graph showing transmittance before and after sunlight exposure according to the principles of the invention in which the number of laminated layers of a thin film encapsulation layer is varied.

Figure 6:
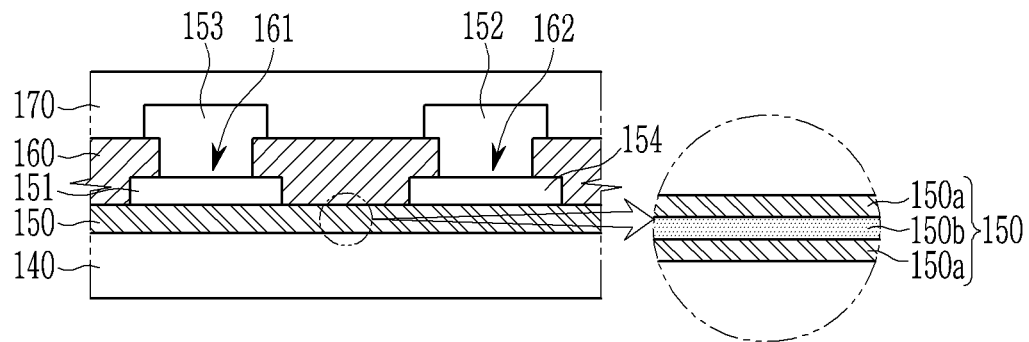
FIG. 6 is a cross-sectional view showing an exemplary embodiment of a display device constructed according to the principles of the invention.

FIG. 6 is a cross-sectional view showing a display device according to an exemplary embodiment of the invention. Referring to FIG. 6, the display device according to the illustrated exemplary embodiment is substantially the same as the display device of FIG. 1, except that a protection layer 150 is disposed between the thin film encapsulation layer 140 and the thin film encapsulation layer 140. The protection layer 150 includes the first material having the first refractive index and the second material having the second refractive index alternately laminated to each other to form at least three layers. Since the display devices of FIGS. 1 and 6 are substantially the same as each other, repeated descriptions for substantially the same elements will be omitted to avoid redundancy. The display device according to the illustrated exemplary embodiment also blocks light having a wavelength of about 380 nm to about 410 nm wavelength like the display device according to the exemplary embodiment of FIG. 1.

Figure 7:
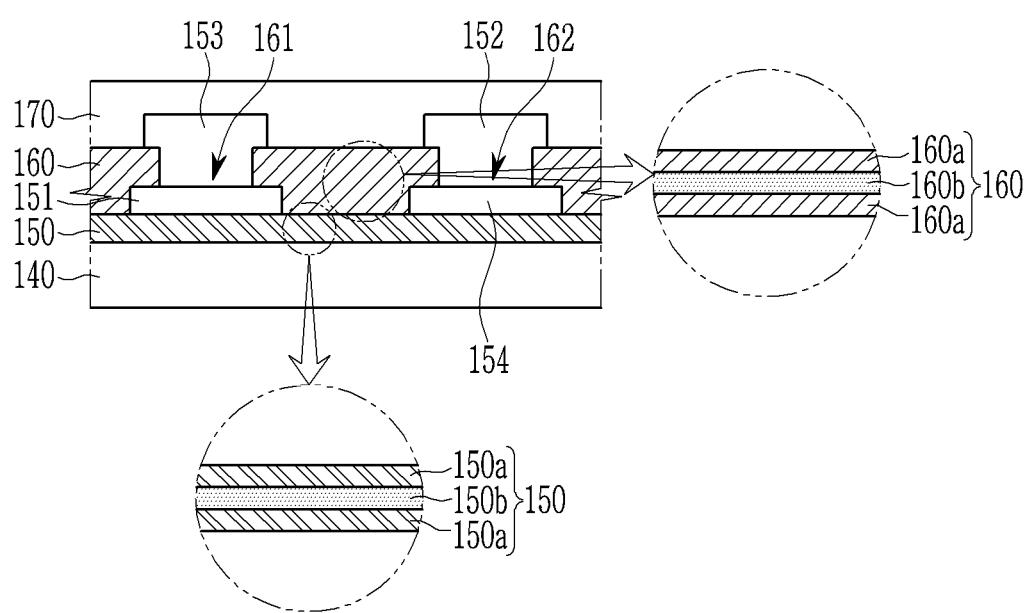
FIG. 7 is a cross-sectional view showing a display device according to an exemplary embodiment of the invention.

According to an exemplary embodiment, both the electrode insulating layer 160 and the protection layer 150 may have a multi-layered structure. FIG. 7 is a view showing such a display device according to an exemplary embodiment of the invention.

Referring to FIG. 7, the display device according to the illustrated exemplary embodiment is substantially the same as the display device of FIG. 7, except that each of the electrode insulating layer 160 and the protection layer 150 includes the first material having the first refractive index and the second material having the second refractive index alternately laminated to each other to form at least three layers. Since the display devices of FIGS. 6 and 7 are substantially the same as each other, repeated descriptions for substantially the same elements will be omitted to avoid redundancy. The display device according to the illustrated exemplary embodiment also blocks light having a wavelength of about 380 nm to about 410 nm like the display device according to the exemplary embodiment of FIG. 1. In this case, since both the electrode insulating layer 160 and the protection layer 150 have the multi-layered structure, light of the corresponding wavelength may also be blocked.

Figure 8:
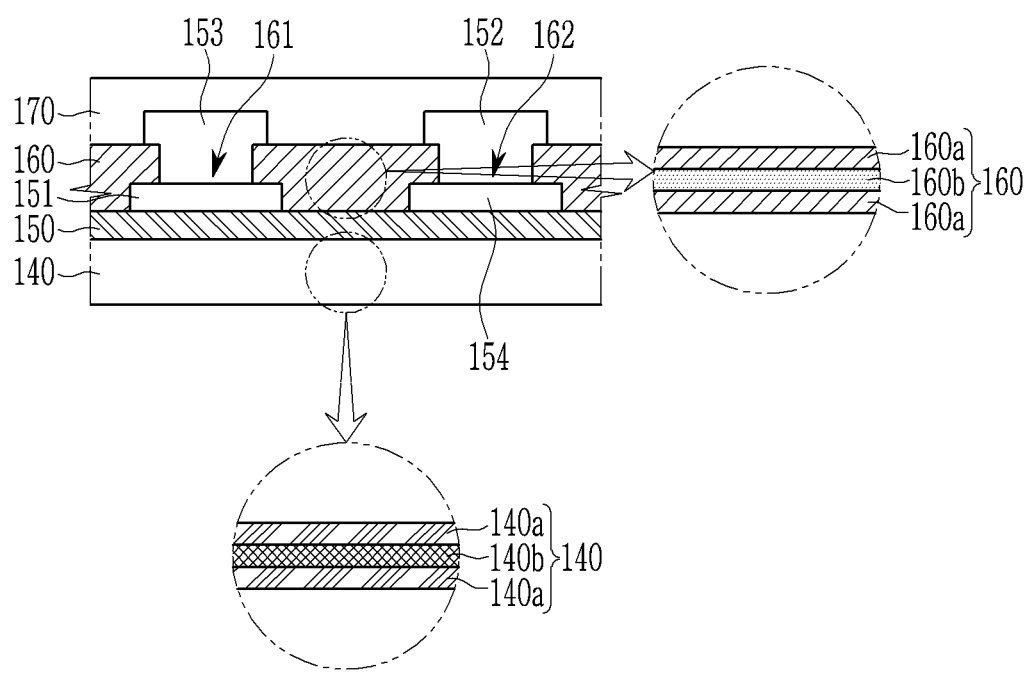
FIG. 8 is a cross-sectional view showing a display device according to an exemplary embodiment of the invention.

According to an exemplary embodiment, the thin film encapsulation layer 140 may have the multi-layered structure. Referring to FIG. 8, the thin film encapsulation layer 140 includes the first material having the first refractive index and the second material having the second refractive index alternately laminated to each other to form at least three layers, as long as the thin film encapsulation layer 140 may also block infiltration of moisture and oxygen. In this case, light having a wavelength of about 380 nm to about 410 nm may also be blocked.

Figure 9:
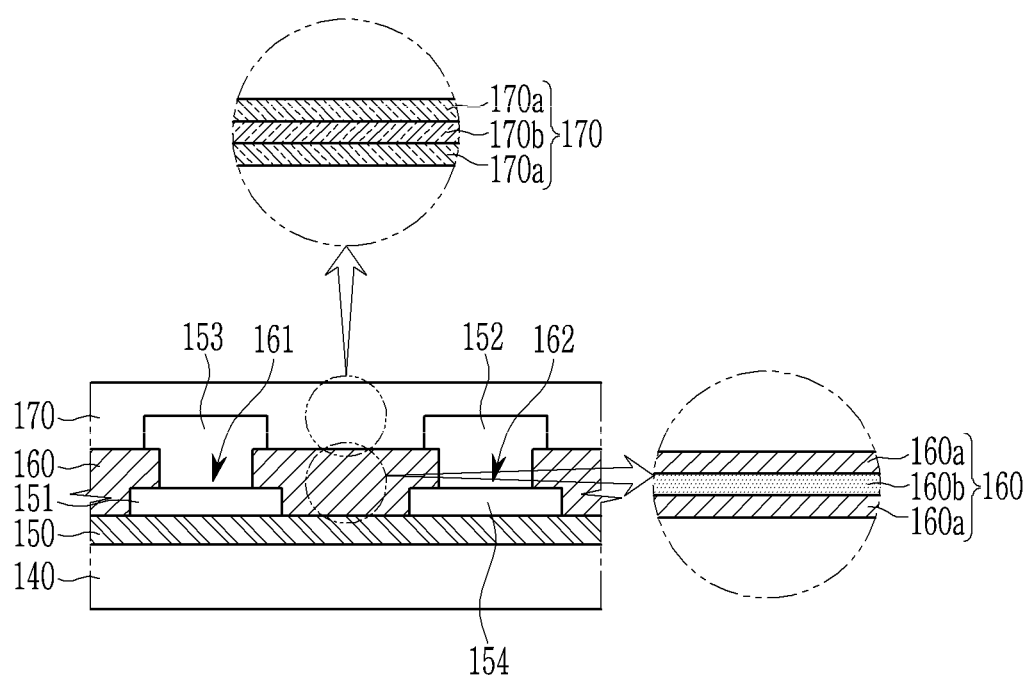
FIG. 9 is a cross-sectional view showing a display device according to an exemplary embodiment of the invention.

According to an exemplary embodiment the capping layer 170 may have the multi-layered structure. Referring to FIG. 9, the capping layer 170 includes the first material having the first refractive index and the second material having the second refractive index alternately laminated to each other to form at least three layers. In this case, light having a wavelength of about 380 nm to about 410 nm may be blocked.

As described above, in display devices constructed according the principles of the invention, at least one of the protection layer 150 and the electrode insulating layer 160 includes the first material having the first refractive index and the second material having the second refractive index alternately laminated to each other to form at least three layers, which may block light having a wavelength of about 380 nm to about 410 nm. Accordingly, the color change in the thin film encapsulation layer 140 may be prevented, and the light-emitting element may be prevented from being damaged by exposure to UV light.

Hereinafter, the detailed structure of the display device including the touch sensor will be described in detail with reference to accompanying drawings according to exemplary embodiments. However, the inventive concepts are not limited thereto, and the structure of the display device according to exemplary embodiments may be varied.

Figure 10:
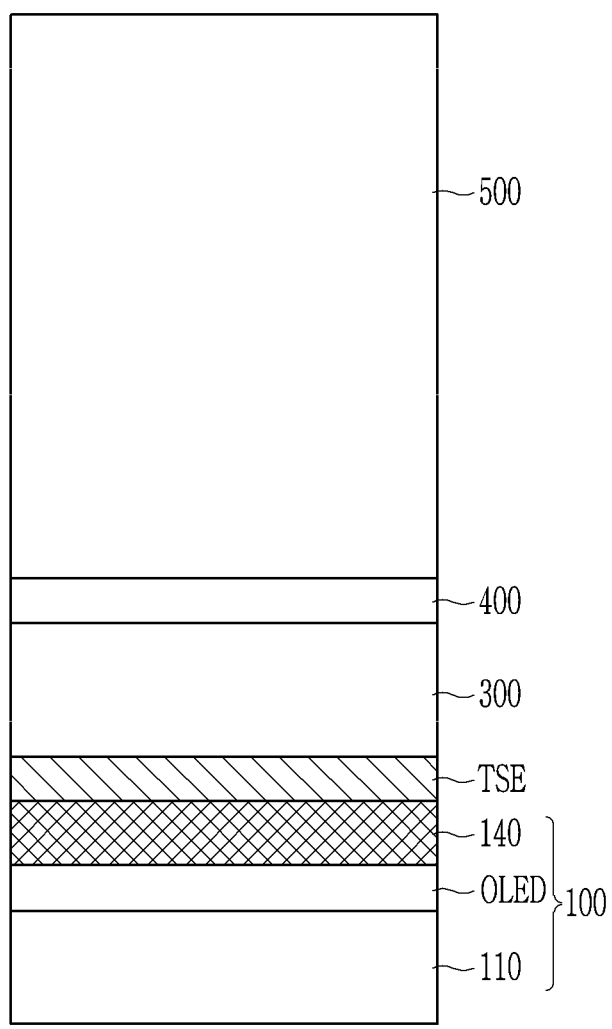
FIG. 10 is a schematic cross-sectional view of a display device according to an exemplary embodiment of the invention.

FIG. 10 a cross-sectional view of a display device 1000. Referring to FIG. 10, the display device 1000 according to the illustrated exemplary embodiment includes a sensing electrode layer TSE disposed on a display panel 100, a polarizer 300 disposed on the sensing electrode layer TSE, a film 400 disposed on the polarizer 300, and a window 500 disposed on the film 400. The sensing electrode layer TSE may include the first sensing electrode 151 and the second sensing electrode 152 insulated from each other by the electrode insulating layer 160, as shown in FIG. 1.

The display panel 100 includes a light-emitting element layer OLED disposed on a substrate 110, and a thin film encapsulation layer 140 disposed on the light-emitting element layer OLED. As shown in FIG. 10, the sensing electrode layer TSE is disposed directly on the thin film encapsulation layer 140, and the polarizer 300 is disposed directly on the sensing electrode layer TSE. That is, as the sensing electrode layer TSE is formed on the thin film encapsulation layer 140, a separate adhesion process to the touch sensor may not be required, which may reduce the thickness of the display device 1000.

Figure 11:
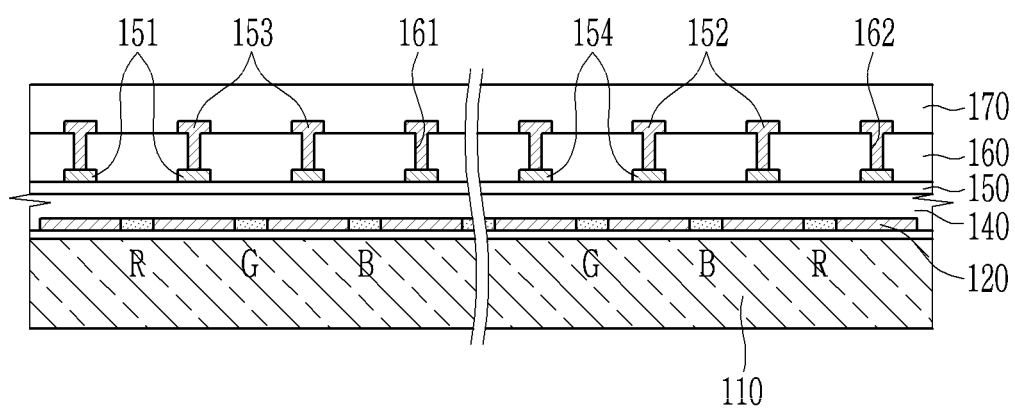
FIG. 11 is a schematic partial cross-sectional view of a display device according to an exemplary embodiment of the invention.
Figure 12:
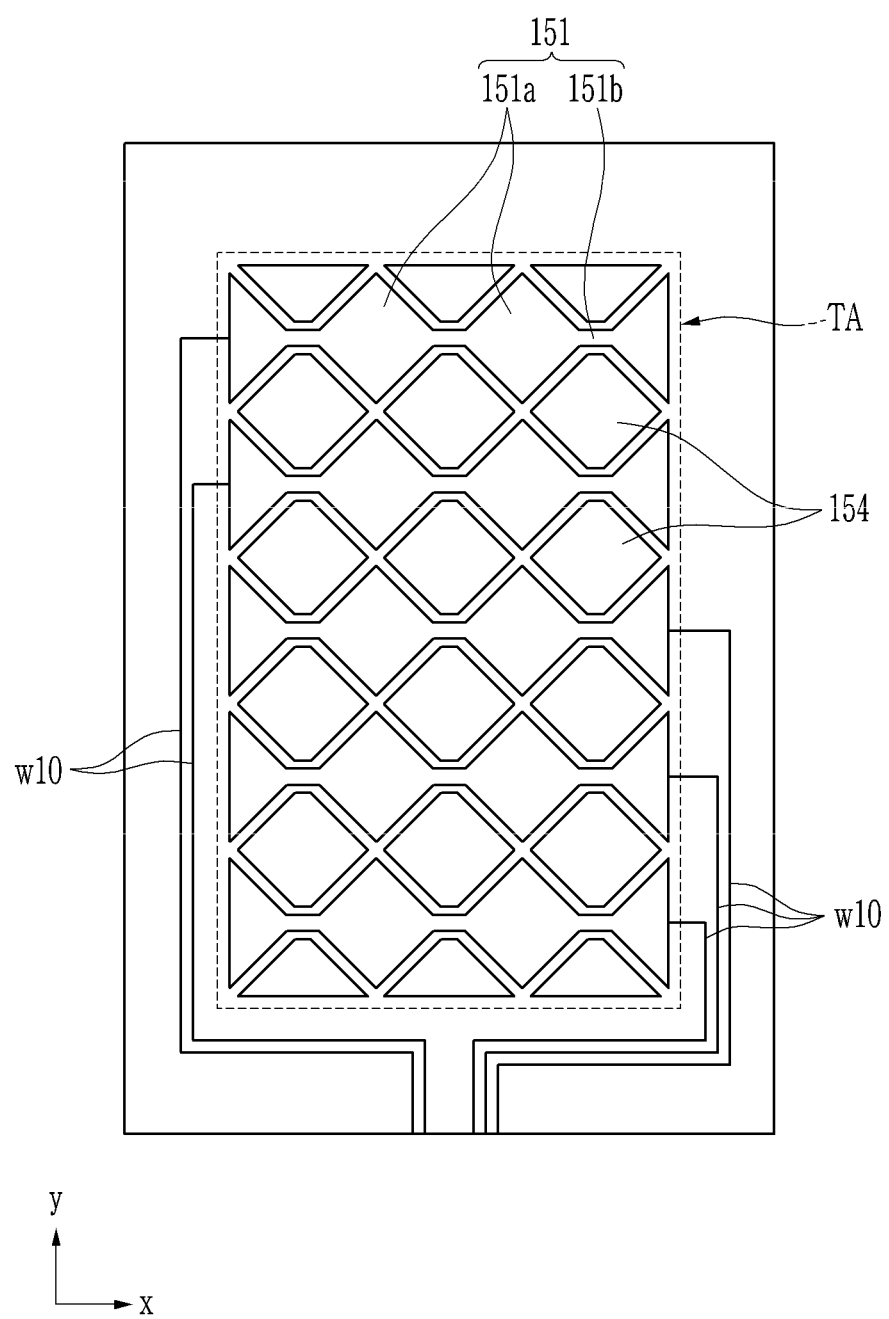
FIG. 12 and FIG. 13 are top plan views schematically showing a first sensing electrode and a second sensing electrode of the display device shown in FIG. 11.
Figure 13:
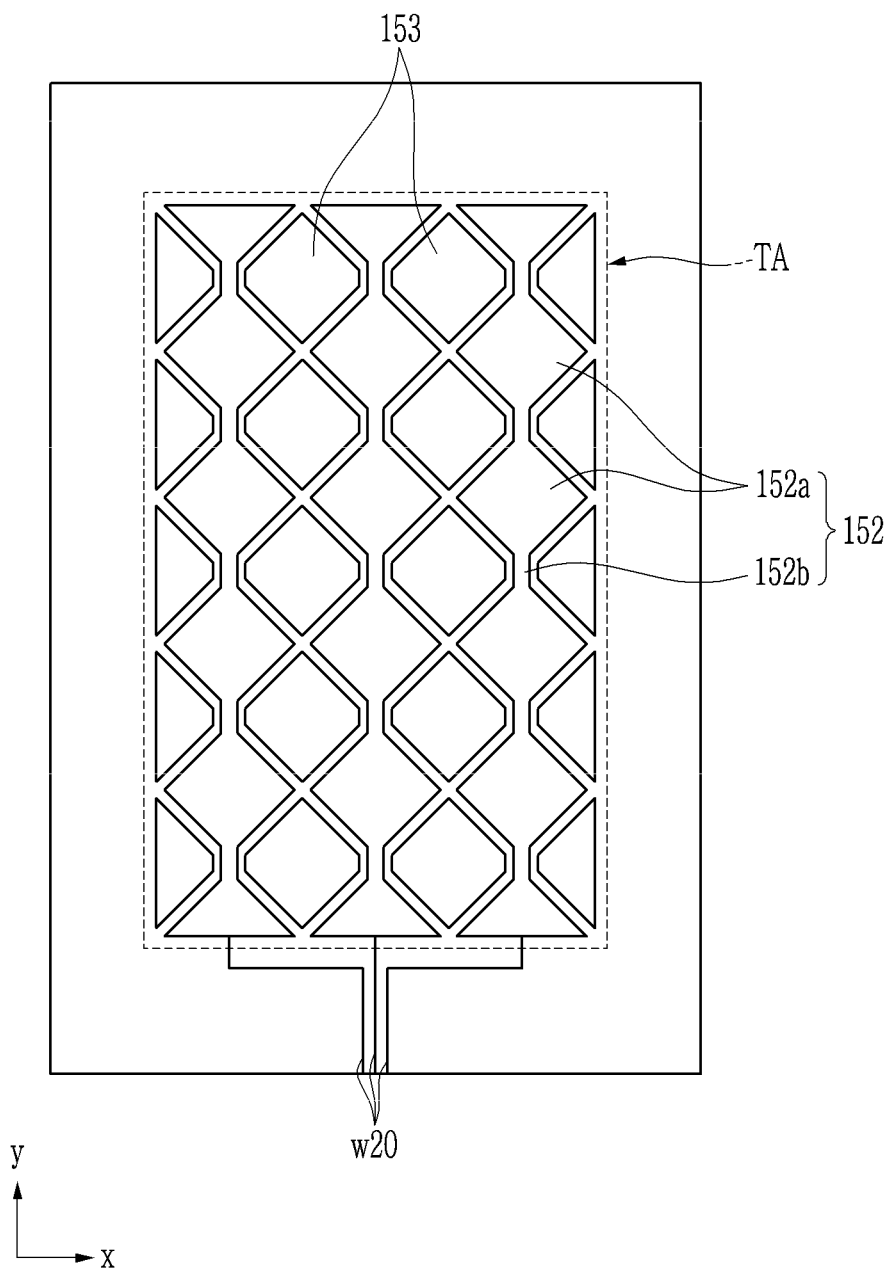

Next, the sensing electrode layer TSE will be described in detail with reference to FIG. 11 to FIG. 13. FIG. 11 is a cross-sectional view of a display device according to an exemplary embodiment. FIG. 12 and FIG. 13 are schematic top plan views of the first sensing electrode 151 and the second sensing electrode 152 of the display device shown in FIG. 11.

Referring to FIG. 11, a display unit 120 is disposed on the substrate 110. The display unit 120 includes a plurality of pixels spaced apart from each other, and displays an image by a combination of light emitted from the plurality of pixels. Each pixel may emit light of red R, green G, and blue B. The display unit 120 is encapsulated by the thin film encapsulation layer 140. The protection layer 150 is disposed on the thin film encapsulation layer 140. The protection layer 150 may be the protection layer 150 described in FIG. 6, which includes the first material having the first refractive index and the second material having the second refractive index alternately laminated to each other to form at least three layers.

The first sensing electrode 151 may be disposed on the protection layer 150. The first sensing electrode 151 is insulated from the second sensing electrode 152 via the electrode insulating layer 160.

A second auxiliary electrode 154 may be disposed on the same layer as the first sensing electrode 151, and a first auxiliary electrode 153 may be disposed on the same layer as the second sensing electrode 152. The first sensing electrode 151 may be connected to the first auxiliary electrode 153 through the first opening 161 of the electrode insulating layer 160. Likewise, the second sensing electrode 152 may be connected to the second auxiliary electrode 154 though the second opening 162 of the electrode insulating layer 160.

The electrode insulating layer 160 is the same as the electrode insulating layer 160 of FIG. 1, which includes the first material having the first refractive index and the second material having the second refractive index alternately laminated to each other to form at least three layers.

The capping layer 170 is disposed on the second sensing electrode 152 and the first auxiliary electrode 153.

Next, the configuration of the first sensing electrode 151, the first auxiliary electrode 153, the second sensing electrode 152, and the second auxiliary electrode 154 will be described in detail with reference to FIG. 12 and FIG. 13 along with FIG. 11.

Referring to FIG. 11 to FIG. 13, the display device includes the first auxiliary electrode 153 overlapping the first sensing electrode 151 and connected to the first sensing electrode 151, and the second auxiliary electrode 154 overlapping the second sensing electrode 152 and connected to the second sensing electrode 152. The first auxiliary electrode 153 and the second auxiliary electrode 154 may be formed in the touch region TA, and may be formed to have a mesh shape in a non-pixel area.

The first sensing electrode 151 may include a plurality of first sensing cells 151a having a substantially rhomboidal shape, and a plurality of first connection parts 151b connecting the plurality of first sensing cells 151a along a first direction x. The first sensing electrode 151 may be a Tx touch electrode (a transmitter touch electrode), to which a first touch signal for sensing a coordinate value of a second direction y is transmitted.

The second sensing electrode 152 may include a plurality of second sensing cells 152a having a substantially rhomboidal shape, and a plurality of second connection parts 152b connecting the plurality of second sensing cells 152a along the second direction y. The second sensing electrode 152 may be an Rx touch electrode (a receiver touch electrode), to which a second touch signal for sensing the coordinate value of the first direction x is transmitted.

The first sensing electrode 151 is connected to a first wire w10, and the second sensing electrode 152 is connected to a second wire w20. The first and second sensing electrodes 151 and 152 are formed in the touch region TA, and the first and second wires w10 and w20 are formed in the peripheral area outside the touch region TA. The touch region TA may be a region corresponding to the display unit 120. According to an exemplary embodiment, the shapes of the first sensing cell 151a and the second sensing cell 152a may be varied.

The first sensing electrode 151 and the second auxiliary electrode 154 may include the same material and be disposed on the same layer. The second sensing electrode 152 and the first auxiliary electrode 153 may include the same material and be disposed on the same layer.

In detail, the first sensing electrode 151 and the second auxiliary electrode 154 are formed on the thin film encapsulation layer 140, and the electrode insulating layer 160 covers the first sensing electrode 151 and the second auxiliary electrode 154. The second auxiliary electrode 154 may be independently formed between the plurality of first sensing cells 151a and may have a substantially rhomboidal shape.

The second sensing electrode 152 and the first auxiliary electrode 153 are formed on the electrode insulating layer 160, and the electrode insulating layer 160 covers the second sensing electrode 152 and the first auxiliary electrode 153. The first auxiliary electrode 153 may be independently formed between the plurality of second sensing cells 152a and may have a substantially rhomboidal shape. According to an exemplary embodiment, the shapes of the first and second sensing cells 151a and 152a, and the first and second auxiliary electrodes 153 and 154 may be varied.

The electrode insulating layer 160 includes a first opening 161 through which the first sensing cell 151a and the first auxiliary electrode 153 may contact each other, thereby connecting the first sensing cell 151a and the first auxiliary electrode 153. Also, the electrode insulating layer 160 includes a second opening 162 though which the second auxiliary electrode 154 and the second sensing cell 152a may contact each other, thereby connecting the second auxiliary electrode 154 and the second sensing cell 152a.

The first and second auxiliary electrodes 153 and 154 may reduce linear resistance in the first and second sensing electrodes 151 and 152, respectively, which may minimize a resistor-capacitor (RC) delay. Also, since the second touch signal flows to the second auxiliary electrode 154 adjacent to the first sensing cell 151a, and the first touch signal flows to the first auxiliary electrode 153 adjacent to the second sensing cell 152a, intensity of an electric field between the first sensing cell 151a and the second sensing cell 152a may be maximized to increase sensing sensitivity of the touch sensor. However, the inventive concepts are not limited thereto, and the structure of the first sensing electrode 151 and the second sensing electrode 152 may be varied from that described above.

Figure 14:
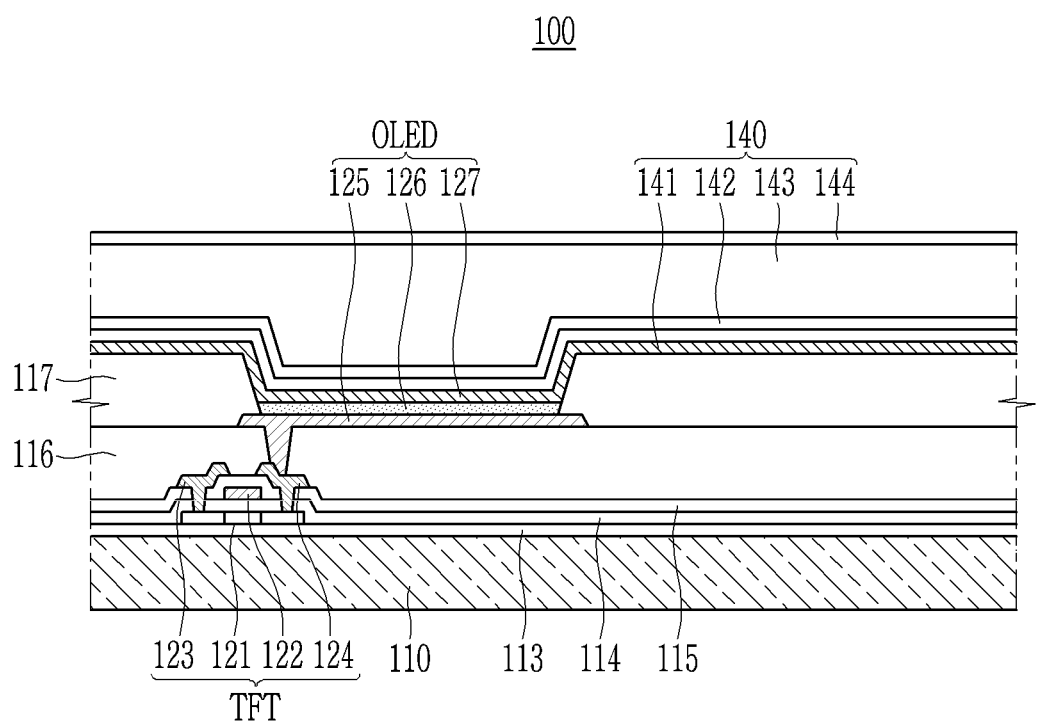
FIG. 14 is a cross-sectional view of a display panel according to an exemplary embodiment of the invention.

Next, the structure of the display panel 100 will be described in detail. FIG. 14 is a cross-sectional view of the display panel 100 according to an exemplary embodiment. The display panel 100 will be described as an organic light emitting device, however, the inventive concepts are not limited thereto.

Referring to FIG. 14, a buffer layer 113 is disposed on the substrate 110, and a semiconductor layer 121 is disposed on the buffer layer 113. The semiconductor layer 121 includes a channel region, which is not doped with an impurity, and a source region and a drain region, which are disposed at opposite sides of the channel region and are doped with an impurity. A gate insulating layer 114 is disposed on the semiconductor layer 121, and a gate electrode 122 is disposed on the gate insulating layer 114. The gate electrode 122 overlaps the channel region of the semiconductor layer 121.

An interlayer insulating layer 115 is disposed on the gate electrode 122, and a source electrode 123 and a drain electrode 124 are disposed on the interlayer insulating layer 115. The source electrode 123 and the drain electrode 124 are respectively connected to the source region and the drain region of the semiconductor layer 121 through a via hole formed in the interlayer insulating layer 115 and the gate insulating layer 114. The thin film transistor TFT may be a driving thin film transistor, and is covered by a planarization layer 116.

A pixel electrode 125 is disposed on the planarization layer 116. One pixel electrode 125 is disposed per pixel, and is connected to the drain electrode 124 of the driving thin film transistor TFT through a via hole formed in the planarization layer 116. A pixel definition layer 117 is disposed on the planarization layer 116 and the pixel electrode 125. The pixel definition layer 117 forms an opening, thereby exposing a center part of the pixel electrode 125 on which an emission layer 126 is disposed.

The emission layer 126 is disposed on the pixel electrode 125, and a common electrode 127 is disposed on the emission layer 126 and the pixel definition layer 117. The common electrode 127 is disposed on the entire display unit 120 regardless of the pixels. One of the pixel electrode 125 and the common electrode 127 injects holes to the emission layer 126, and the other injects electrons to the emission layer 126. The electrons and the holes are combined in the emission layer 126 to generate excitons, and light is emitted by energy generated when the excitons drop from an excited state to a ground state.

The pixel electrode 125 may be formed of a reflective layer, and the common electrode 127 may be formed of a transparent layer or a transflective layer. Light emitted from the emission layer 126 is reflected from the pixel electrode 125 and transmits through the common electrode 127 to be emitted to the outside. When the common electrode 127 is formed of the transflective layer, part of the light reflected from the pixel electrode 125 is again reflected from the common electrode 127, thereby forming a resonance structure and increasing light extraction efficiency.

The thin film encapsulation layer 140 encapsulates the organic light emitting diode (OLED), thereby preventing penetration of external moisture and oxygen as an organic light emitting diode (OLED) is very vulnerable to the moisture and oxygen. The thin film encapsulation layer 140 may have a multilayer structure including an inorganic layer and an organic layer. For example, the thin film encapsulation layer 140 may include a buffer layer 141, a first inorganic layer 142, an organic layer 143, and a second inorganic layer 144 that are sequentially laminated on the common electrode 127. The buffer layer 141 may include LiF, and the first inorganic layer 142 and the second inorganic layer 144 may include one among $Al_2O_3$, $SiN_x$, and $SiO_2$. The organic layer 143 may include one among epoxy, acrylate, and urethane acrylate. The thin film encapsulation layer 140 may have a very thin thickness to reduce the overall thickness of the display device, which may be advantageous for forming a flexible display device. However, the inventive concepts are not limited thereto, and the thin film encapsulation layer 140 may include the first material having the first refractive index and the second material having the second refractive index alternately laminated to each other to form at least three layers as described herein, including in FIG. 9.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a light-emitting element;
   a thin film encapsulation layer disposed on the light-emitting element;
   a protection layer disposed on the thin film encapsulation layer;
   a first sensing electrode disposed on the protection layer;
   an insulating layer disposed on the first sensing electrode;
   a first auxiliary electrode disposed on the insulating layer;
   a second sensing electrode disposed on the insulating layer,
   wherein: at least one of the thin film encapsulation layer and the insulating layer comprises a multi-layered structure including first and second alternating layers forming at least three layers; the first layer comprises a first material having a first refractive index and the second layer comprises a second material having a second refractive index less than the first refractive index;
   the insulating layer has a first opening overlapping the first sensing electrode; and
   the first auxiliary electrode overlaps the first opening.

2. The display device of claim 1, wherein a difference between the refractive indices of the first material and the second material is at least about 0.3.

3. The display device of claim 1, wherein the first refractive index is in a range of about 1.8 to about 2.5.

4. The display device of claim 1, wherein the first layer has a thickness in a range of about 400 angstroms to about 600 angstroms.

5. The display device of claim 1, wherein the second refractive index is in a range of about 1.4 to about 1.5.

6. The display device of claim 5, wherein the second layer has a thickness in a range of about 600 angstroms to about 800 angstroms.

7. The display device of claim 1, wherein: the first material comprises at least one of SiNx, Al2O3, and TiOx; and the second material comprises at least one of SiOx, SiOC, and SiC.

8. The display device of claim 1, wherein: the protection layer comprises the multi-layered structure forming at least five layers of material having alternating refractive indices; and transmittance of light having a wavelength of about 380 nm to about 410 nm through the display device is less than about 0.8.

9. The display device of claim 1, wherein:
   the insulating layer comprises the multi-layered structure forming at least five layers of material having alternating refractive indices; and transmittance of light having a wavelength of about 380 nm to about 410 nm through the display device is less than about 0.8.

10. The display device of claim 1, further comprising a second auxiliary electrode disposed on the same layer as the first sensing electrode,
    wherein:

the insulating layer has a second opening overlapping the second sensing electrode: and the second auxiliary electrode connects adjacent second sensing electrodes to each other through the second opening.

11. The display device of claim 1, wherein:

the thin film encapsulation layer comprises the multi-layered structure; and a difference of refractive indices between the first and second layers is at least about 0.3.

12. The display device of claim 1, further comprising a capping layer disposed on the second sensing electrode, wherein the capping layer comprises the multi-layered structure; and a difference of refractive indices between the first and second layers is at least about 0.3.

13. A display device comprising:

a light-emitting element;

a thin film encapsulation layer disposed on the light-emitting element;

a first sensing electrode disposed on the thin film encapsulation layer;

an insulating layer disposed on the first sensing electrode;

a first auxiliary electrode disposed on the insulating layer; and a second sensing electrode disposed on the insulating layer, wherein: the insulating layer comprises a first layer and a second layer alternately stacked upon each other to form at least three layers;

the first layer comprises a first material having a first refractive index and the second layer comprises a second material having a second refractive index less than from the first refractive index;

the insulating layer has a first opening overlapping the first sensing electrode; and the first auxiliary electrode overlaps the first opening.

14. The display device of claim 13, wherein a difference of refractive indices between the first material and the second material is at least about 0.3.

15. The display device of claim 13, wherein:

the first refractive index is in a range of about 1.8 to about 2.5; and the thickness of the first layer is in a range of about 400 angstroms to about 600 angstroms.

16. The display device of claim 13, wherein:

the second refractive index is in a range of about 1.4 to about 1.5; and the thickness of the second layer is in a range of about 600 angstroms to about 800 angstroms.

17. A flexible display device comprising:

a light-emitting element;

an encapsulation layer disposed on the light-emitting element;

touch sensing electrodes disposed on the encapsulation layer;

an insulating layer disposed between the touch sensing electrodes; and a first auxiliary electrode disposed on the insulating layer, wherein: the encapsulation layer has substantially the same transmittance before and after being exposed to ultraviolet (UV) light;

the insulating layer reflects substantially all UV light incident thereto;

the insulating layer has a first opening overlapping at least one of the touch sensing electrodes; and the first auxiliary electrode overlaps the first opening.

18. The flexible display device of claim 17, wherein at least one of the insulating layer and the encapsulation layer comprises a multi-layered structure forming at least three layers of material having alternating refractive indices.

* * * * *